US007525351B2

United States Patent
Keithley et al.

(10) Patent No.: US 7,525,351 B2
(45) Date of Patent: *Apr. 28, 2009

(54) FIXED FREQUENCY CLOCK OUTPUT HAVING A VARIABLE HIGH FREQUENCY INPUT CLOCK AND AN UNRELATED FIXED FREQUENCY REFERENCE SIGNAL

(75) Inventors: Douglas Gene Keithley, Boise, ID (US); Richard D. Taylor, Eagle, ID (US); Mark D. Montierth, Meridian, ID (US)

(73) Assignee: Marvell International Technology Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/851,432

(22) Filed: Sep. 7, 2007

(65) Prior Publication Data

US 2008/0068048 A1 Mar. 20, 2008

Related U.S. Application Data

(63) Continuation of application No. 10/696,811, filed on Oct. 30, 2003, now Pat. No. 7,282,967.

(51) Int. Cl.
  *H03B 21/00* (2006.01)
(52) U.S. Cl. ............................. 327/105; 327/107
(58) Field of Classification Search ......... 327/105–107, 327/164–166
  See application file for complete search history.

(56) References Cited

U.S. PATENT DOCUMENTS

| 5,694,089 | A | 12/1997 | Adachi et al. |
| 5,719,512 | A | 2/1998 | Murayama |
| 5,821,816 | A | 10/1998 | Patterson |
| 6,107,843 | A | 8/2000 | de Gouy et al. |
| 6,353,649 | B1 | 3/2002 | Bockleman et al. |
| 6,366,174 | B1 | 4/2002 | Berry et al. |
| 6,396,314 | B1 | 5/2002 | Roth |
| 6,518,801 | B1 | 2/2003 | Janesch |
| 6,559,698 | B1 | 5/2003 | Miyabe |
| 6,697,416 | B1 * | 2/2004 | Jennings ..................... 375/130 |
| 6,703,875 | B1 * | 3/2004 | Chuang ...................... 327/144 |
| 6,798,302 | B2 * | 9/2004 | Starr et al. .................... 331/78 |
| 7,065,172 | B2 * | 6/2006 | Xiu et al. ..................... 375/376 |
| 7,145,371 | B2 | 12/2006 | Keithley et al. |
| 7,282,967 | B2 * | 10/2007 | Keithley et al. ............. 327/105 |

FOREIGN PATENT DOCUMENTS

| EP | 0338742 A2 | 10/1989 |
| EP | 0546466 A1 | 6/1993 |
| WO | WO 03079553 A1 | 9/2003 |

* cited by examiner

*Primary Examiner*—Lincoln Donovan
*Assistant Examiner*—Hai L. Nguyen

(57) ABSTRACT

A digital circuit generates very precise clock frequencies for applications that can tolerate a small degree of jitter but require exact long term frequencies, e.g. a video clock for a laser printer. Some subpixel jitter is acceptable, but the overall pixel rate remains exact and consistent. In some applications, the jitter may be desirable to smear the EMI spectrum. For example, if the high frequency input clock is modulated, the edges of the video clock will also be modulated yet remain within the jitter and frequency specification.

13 Claims, 8 Drawing Sheets

FIXED FREQUENCY CLOCK OUTPUT HAVING A VARIABLE HIGH FREQUENCY INPUT CLOCK AND AN UNRELATED FIXED FREQUENCY REFERENCE SIGNAL

CROSS REFERENCE TO RELATED APPLICATIONS

The present application is a continuation of, and claims priority to, U.S. patent application Ser. No. 10/696,811, filed Oct. 30, 2003, entitled "FIXED FREQUENCY CLOCK OUTPUT HAVING A VARIABLE HIGH FREQUENCY INPUT CLOCK AND AN UNRELATED FIXED FREQUENCY REFERENCE SIGNAL," now issued as U.S Pat. No. 7,282,967.

BACKGROUND

In the prior art, a high frequency embedded phase lock loop (PLL) can be used to provide a fixed-frequency video clock input frequency. Additional crystals or oscillators may be required to provide the desired frequency or modify the output frequency. The input frequency is fixed. Each clock requires a separate PLL. The video frequency cannot be easily changed without impacting the entire system. PLLs consume considerable application specific integrated circuit (ASIC) real estate and crystals are expensive. Changing video frequencies may require board changes. For some applications, e.g. inline laser printing, the video frequencies must be calibrated to the print engine mechanism so board changes are not practical.

In the prior art, complicated tap-delay feedback loops are used. The delay elements require custom layout. The design requires real-time calibration to adjust for process, voltage, temperature (PVT) and PVT drift. Delay elements require complicated production testing procedures, and delay elements are not portable. A dithered input reference cannot be used and the output frequency spectrum cannot be easily smeared to reduce radio frequency interference (RFI). Due to the complex calibration and testing features, the design is large.

SUMMARY

The present invention generates very precise clock frequencies for applications that can tolerate a small degree of jitter but require exact long term frequencies, e.g. a video clock for a laser printer. Some subpixel jitter is acceptable, but the overall pixel rate must be exact and consistent. In some applications, the jitter may be desirable to smear the EMI spectrum. For example, if the high frequency input clock is modulated, the edges of the video clock will also be modulated yet remain within the jitter and frequency specification.

In its simplest form, the frequency synthesizer receives a dithered signal and a reference signal. From these two inputs, a constant frequency signal is generated. The dithered signal may be provided by an optional modulated analog PLL that receives a reference signal, Fref. The frequency synthesizer receives the output of the PLL Fdither, as an input frequency and the reference signal Fref to generate the video clock frequency signal Fout. Configuration registers transceive data and control with the PLL and the frequency synthesizer.

In one embodiment of the frequency synthesizer, a "simple predictor and corrector" receives the dithered signal Fdither and the reference signal Fref. From these inputs, it generates a "remove pulse" signal. An output generator, that receives the Fdither, Fref, and "remove pulse" signals, generates a "clear pulse" signal and the video frequency signal. Both the "simple predictor and corrector" and the output generator transceive data and control with the configuration registers.

In another embodiment of the frequency synthesizer, a predictor receives a dithered signal Fdither and a reference signal Fref. A corrector receives Fdither, Fref, and the output of the predictor. The output of the corrector indicates the fractional number of clocks to remove. An accumulator receives the corrector output and Fdither. From the accumulator output and Fdither, an output generator generates a constant frequency signal, Fout. All of the aforementioned blocks transceive data and control with the configuration registers.

DETAILED DESCRIPTION

The invention provides a method for generating very precise clock frequencies for applications that can tolerate a small degree of jitter but require exact long term frequencies, e.g. a video clock for a laser printer. Some subpixel jitter is acceptable, but the overall pixel rate must be exact and consistent. In some applications, the jitter may be desirable to smear the EMI spectrum. For example, if the high frequency input clock is modulated, the edges of the video clock will also be modulated yet remain within the jitter and frequency specification.

The invention takes advantage of a known fixed reference frequency and a high speed dithered clock. A known reference interval is used to calculate how many output clock edges (or pulses) should have occurred. By comparing the expected number of output transitions to the actual, it can correct the error suppressing or "swallowing" edges or pulses on the output. This statistically reduces the cumulative error to near zero.

In operation, the frequency synthesizer receives a dithered signal and a stable reference signal. From these two inputs, a constant frequency signal is generated.

Figure 1:
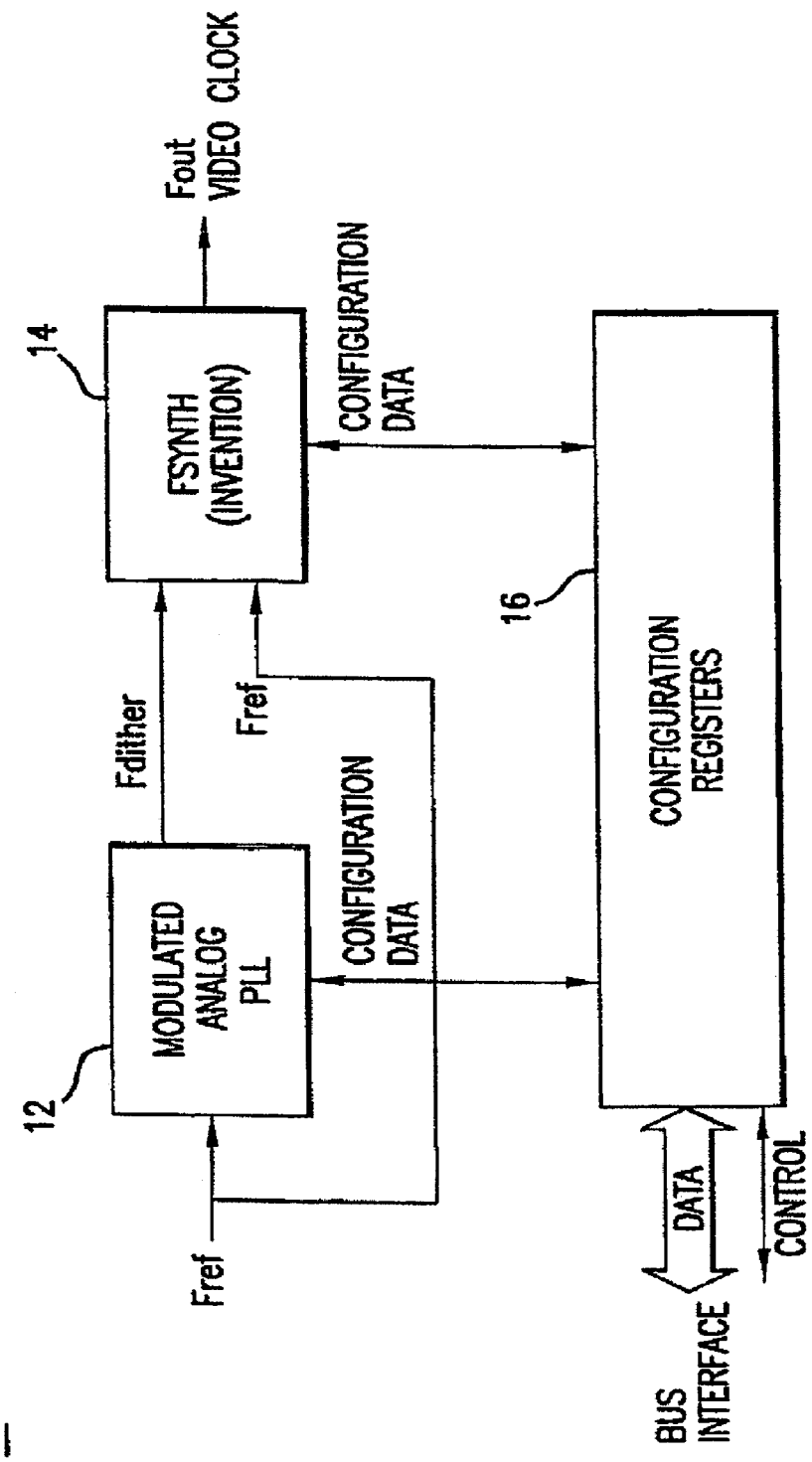
FIG. 1 is a functional block diagram of a system 10 of the present invention.

FIG. 1 is a functional block diagram of a system 10 of the present invention. An optional modulated analog PLL 12 receives a reference signal, Fref. A frequency synthesizer 14 receives the output of the PLL, Fdither, as an input frequency and the reference signal Fref to generate the video clock frequency signal Fout. Configuration registers 16 transceive data and control with the PLL 12 and the frequency synthesizer 14.

In an illustrative application, a laser printer controller requires an exact pixel rate of 20.12345 MHz. Subpixel resolution is required in the output signal. The video clock generated may be up to 12 times that frequency (12*20.12345 MHz=241.4814 MHz). The rest of the controller system needs a ~250 MHz clock and a fixed I/O frequency of 48.000 MHz. The ~250 MHz clock will be further modulated to reduce EMI. The video frequency will be generated from clocks already in the system, e.g. 48.000 MHz and 500+/−10 MHz from the PLL. Fout cannot exceed half of the slowest frequency, e.g. 245 MHz. The video output should be the highest multiple of the video frequency possible while remaining lower than half of the slowest dithered input clock.

Figure 2:
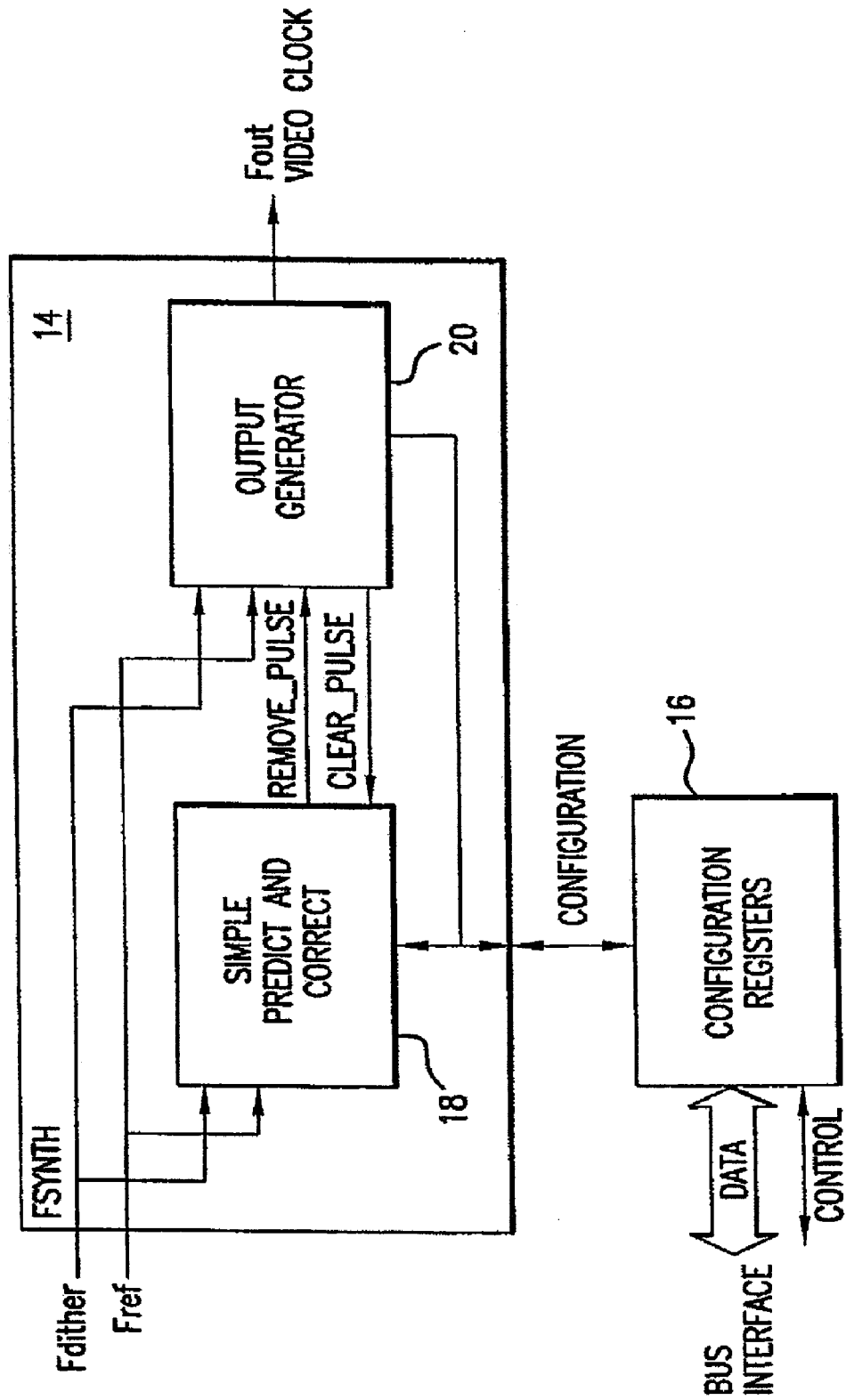
FIG. 2 is a functional block diagram of an embodiment of the frequency synthesizer 14 shown in FIG. 1.

FIG. 2 is a functional block diagram of an embodiment of the frequency synthesizer 14 shown in FIG. 1. A "simple predictor and corrector" 18 receives the dithered signal Fdither and the reference signal Fref. From these inputs, it generates a "remove pulse" signal. An output generator 20, that receives the Fdither, Fref, and "remove pulse" signals, generates a "clear pulse" signal and the video frequency signal. Both the "simple predictor and corrector" 18 and the output generator 20 transceive data and control with the configuration registers 16.

Figure 3:
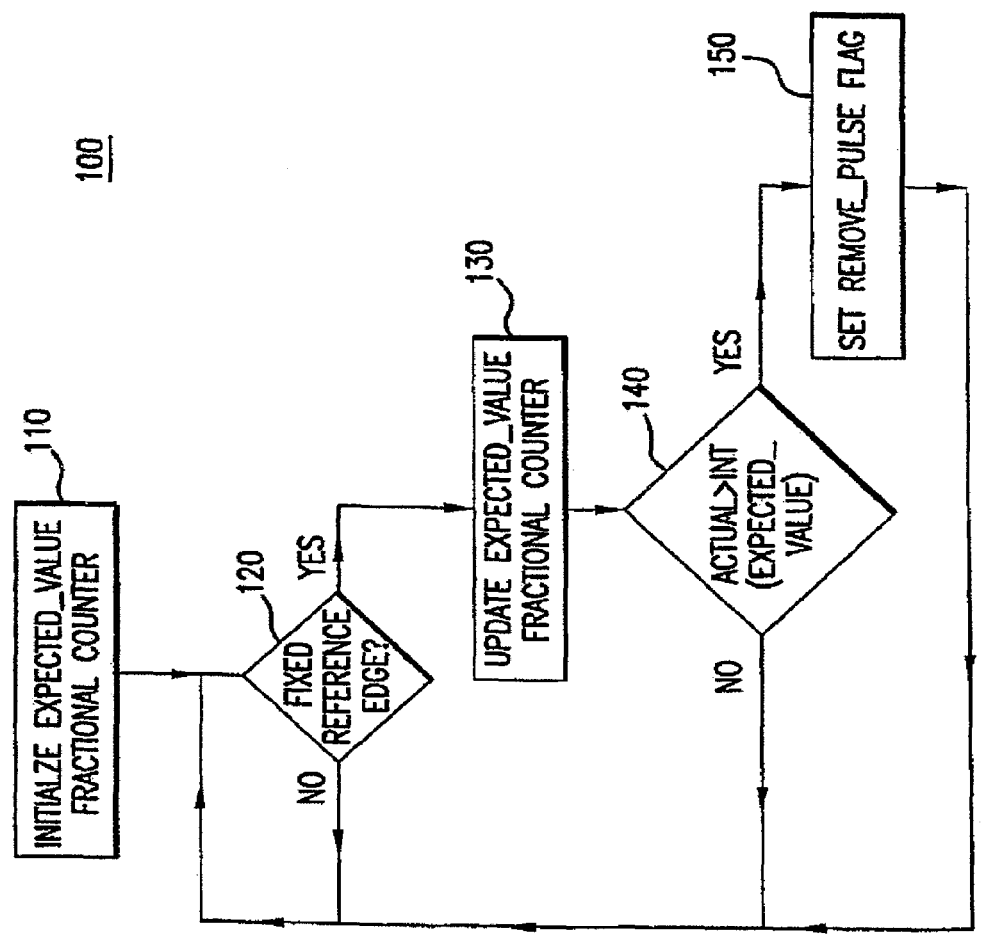
FIG. 3 illustrates a flow process diagram 100 for the "simple predictor and corrector" 18 shown in FIG. 2.

FIG. 3 illustrates a flow process diagram 100 for the "simple predictor and corrector" 18 shown in FIG. 2. In step 110, the expected_value fractional counter is initialized. In step 120, it is determined whether a fixed reference edge has been received. If no, step 120 is repeated. If yes, in step 130, the expected_value fractional counter is updated. In step 140, it is determined whether the actual value is greater than the integer of the expected value fractional counter. If no, step 120 is repeated. If yes, in step 150, the "remove pulse" flag is set.

Figure 4:
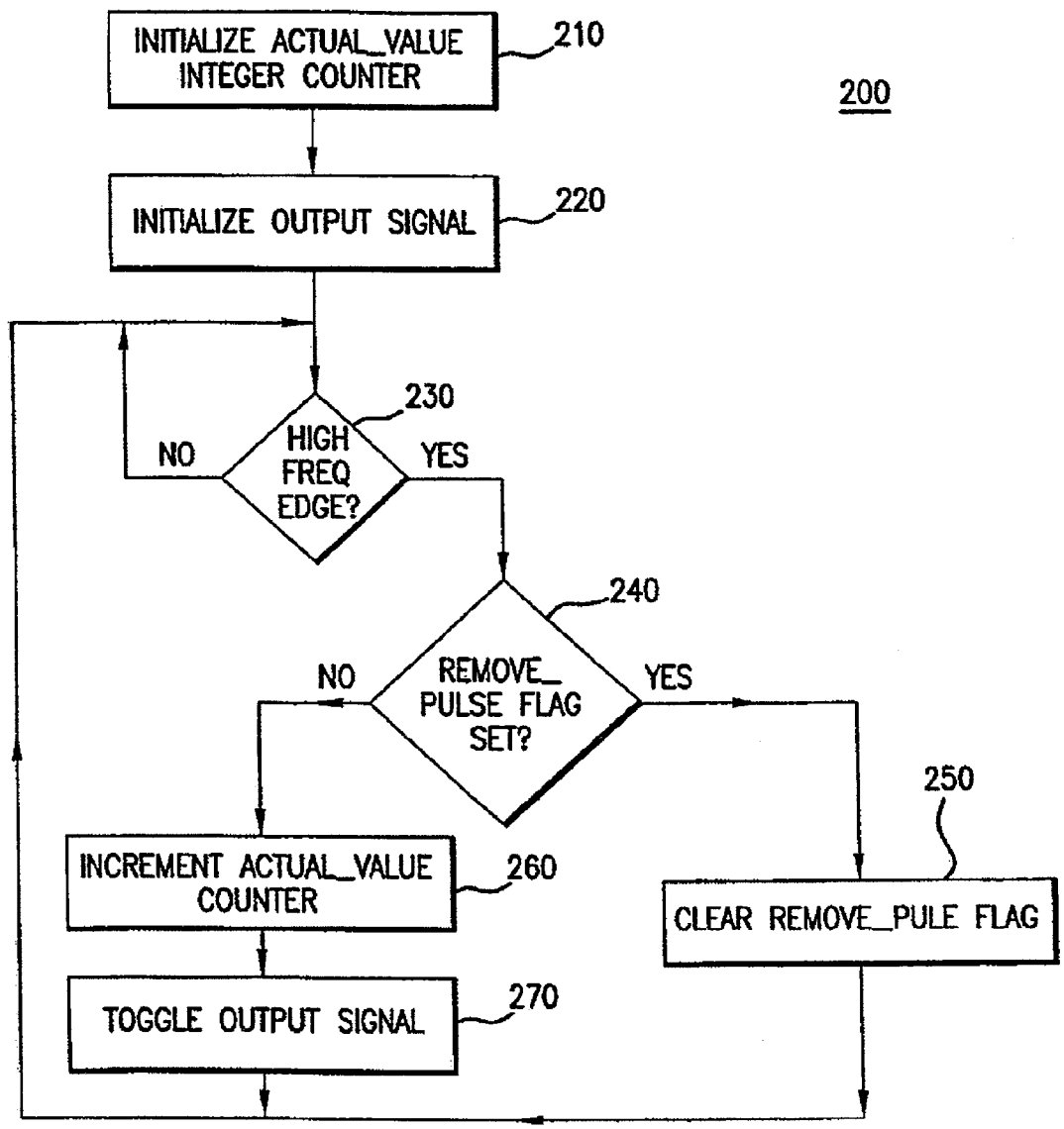
FIG. 4 illustrates a flow process diagram 200 for the output generator 20 shown in FIG. 2.

FIG. 4 illustrates a flow process diagram 200 for the output generator 20 shown in FIG. 2. In step 210, the actual_value integer counter is initialized. In step 220, the output signal is initialized. In step 230, it is determined if there is a high frequency edge. If no, step 230 is repeated until a high frequency edge is detected. If yes, then in step 240, it is determined if remove_pulse flag has been set. If yes, then in step 250, the remove_pulse flag is cleared and the process returns to step 230. If no, then in step 260, the actual_value counter is incremented. In step 270, the output signal is toggled, and the process returns to step 230.

Figure 5:
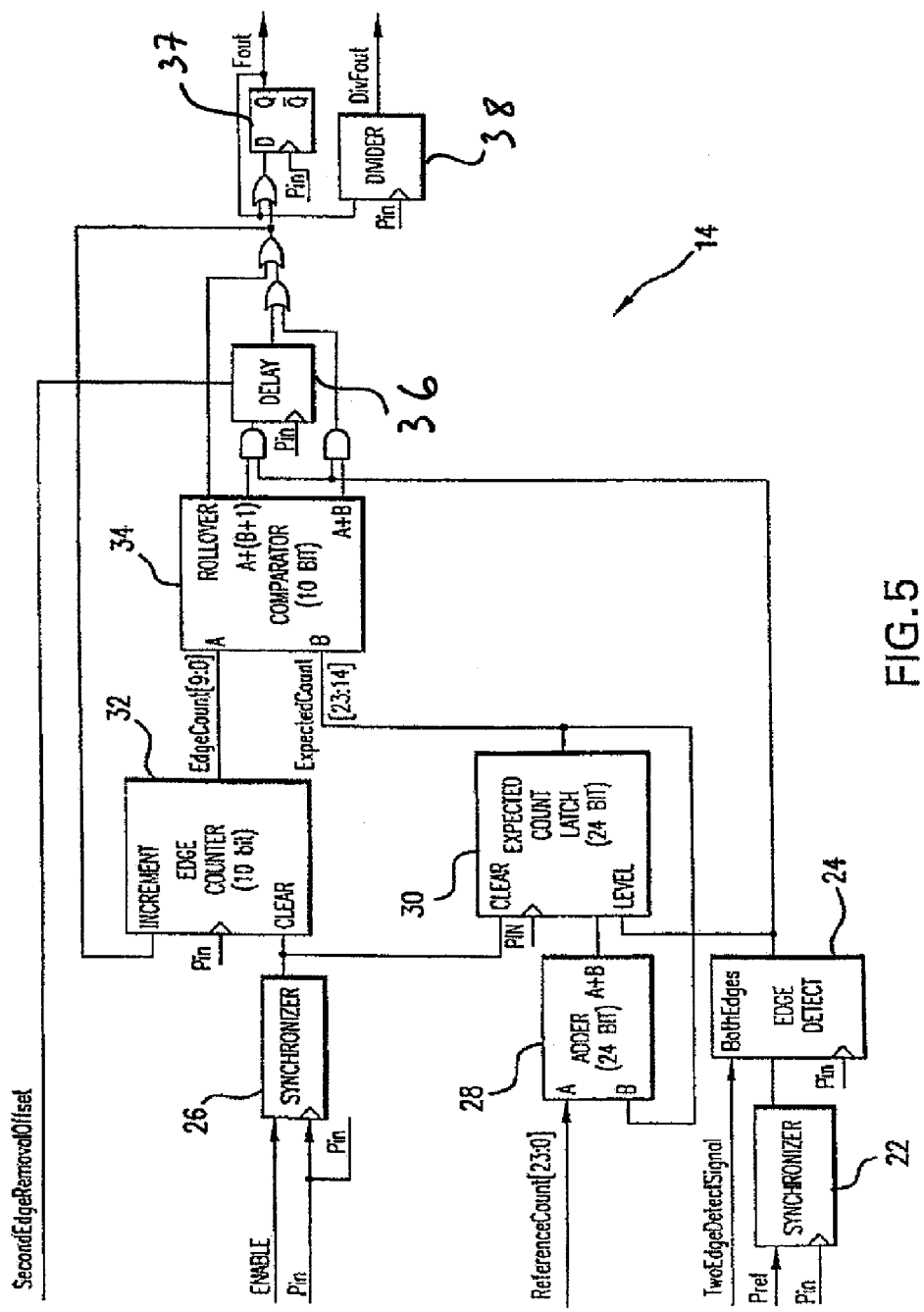
FIG. 5 is an alternate functional block diagram of the frequency synthesizer 14.

The embodiment shown in FIG. 5 allows a single pulse to be removed each sample period (the lower fixed frequency clock defines the sample period). FIG. 5 is an alternate functional block diagram of the frequency synthesizer 14. A first synchronizer 22 receives the I/O clock as reference input Fref and $f_{dither}$ (Fin) as a clock input. An edge detector 24, connected to the output of the first synchronizer 22, receives as inputs a "twoedgedetect signal" and $f_{dither}$. A second synchronizer 26 receives an enable signal and $f_{dither}$ as a clock input. A 24-bit adder 28 receives Referencecount[23:0] as an input. An Expected Count Latch 30 receives the output of the second synchronizer 26 as a clear input, $f_{dither}$ as a clock input, the output of the 24-bit Adder 28 as data, and the output of the edge detector 24 as a load signal. The second input of the 24-bit Adder 28 and the output of the Expected Count Latch 30 are tied together. An Edge Counter 32 receives $f_{dither}$ as a clock input and the output of the second synchronizer 26 as a clear signal. A comparator 34 receives the output of the Edge Counter 32 and the output of the Expected Count Latch 30 as inputs. The comparator 34 generates a rollover output, an A>B+1 signal, and an A>B signal. A D-type flip flop 37 may generate a constant frequency signal $F_{out}$, as illustrated in FIG. 5. In various embodiments, the constant frequency signal $F_{out}$ may be input to a divider 38, which may output another constant frequency signal $DF_{out}$, which may be a fraction of $F_{out}$.

ReferenceCount[23:0] represents the expected number of pulses to be counted each reference sample period. It represents a mixed number (integer and fraction).

When the reference frequency is very slow, we may wish to double it. Twoedgedetect indicates that sampling on both Fref clocks edges is required and not just a single edge.

When one needs to remove two pulses in-between reference edges, you may not want adjacent pulses as this increases jitter. To separate the second pulse removal from the first, the request is delayed a certain number of clocks using delay 36.

SecondEdgeRemovalOffset accomplishes this by specifying the number of clocks to delay the second pulse removal. This is a configuration setting that comes from the microprocessor.

In operation, since the pulses are being "swallowed", the modulated (dithered) PLL must never go slower than the desired output frequency. In the present embodiment, the input frequency varies from 490 to 510 MHz. When we divide by 2, the output would be between 245 and 255 MHz, if no edges were swallowed. Since the desired frequency is 241.4814 MHz and the slowest the input clock runs if 245 MHz, this is acceptable. Pulses will always be "swallowed" to attain the desired frequency.

If the dither is +/−20 MHz, then the input could dip to 480 MHz that would lead to a 240 MHz output if no clocks were swallowed. This result is less than our desired frequency of 241.4814 MHz. So, we have to re-adjust the FSYNTH to give us 11*20.1234 MHz=221.3574 MHz, so we remain below the input frequency. The desired frequency is changed by changing the value of the ReferenceCount signal.

Figure 6:
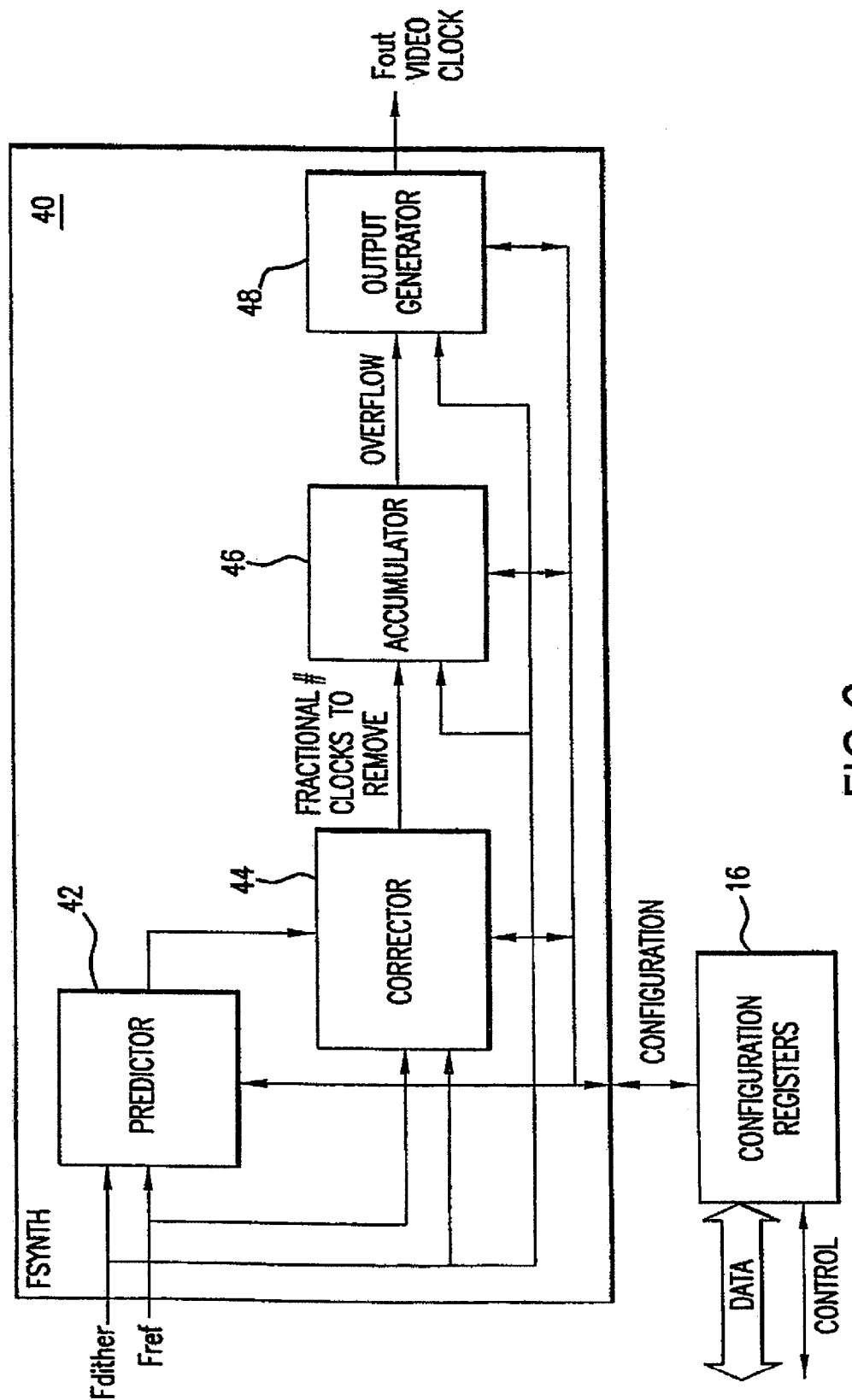
FIG. 6 is functional block diagram of another embodiment of a frequency synthesizer 40 according to the present invention.

FIG. 6 is a functional block diagram of another embodiment of a frequency synthesizer 40 according to the present invention. A predictor 42 receives a dithered signal Fdither and a reference signal Fref. A corrector 44 receives Fdither, Fref, and the output of the predictor 42. The output of the corrector 44 indicates the fractional number of clocks to remove. An accumulator 46 receives the corrector output and Fdither. From the accumulator output and Fdither, an output generator 48 generates a constant frequency signal, Fout. All of the aforementioned blocks transceive data and control with the configuration registers 16.

Figure 7:
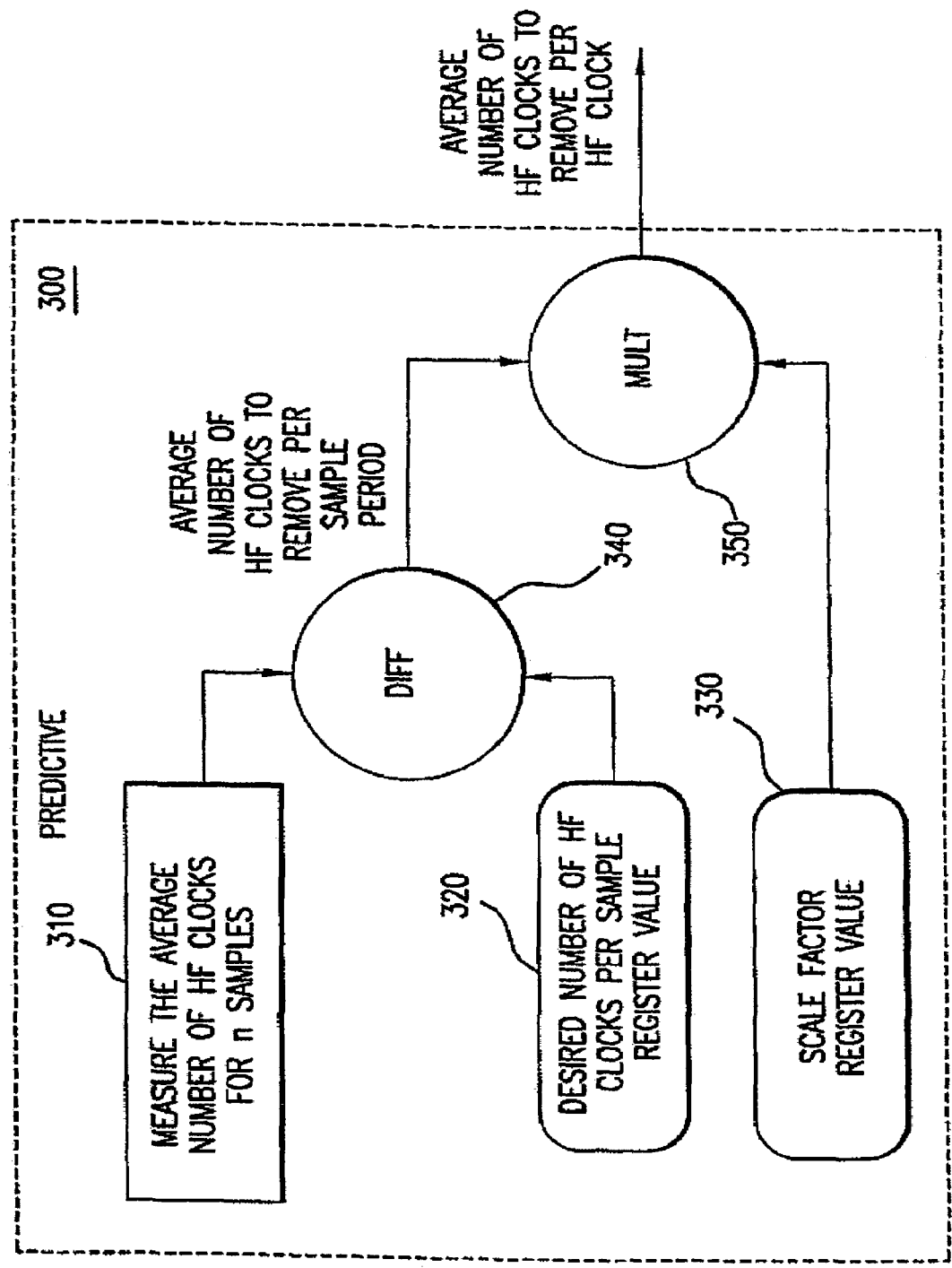
FIG. 7 is a flow process diagram 300 corresponding to the predictor 42 shown in FIG. 6.

FIG. 7 is a flow process diagram 300 corresponding to the predictor 42 shown in FIG. 6. In step 310, the average number of high frequency (HF) clocks or dithered clocks is measured for n samples. N may be programmed by the user via the configuration registers. In step 320, the desired number of HF clocks per sample register is determined via the configuration registers. In step 330, the scale factor register value is determined via the configuration registers. In step 340, the difference between the measured clock periods and desired clock periods is determined. This difference is indicative of the average number of HF clocks to remove per sample period. In step 350, the average number of HF clocks to be removed is multiplied by the scale factor register value. This value indicates the average fractional number of HF clocks to remove each HF clock period.

Figure 8:
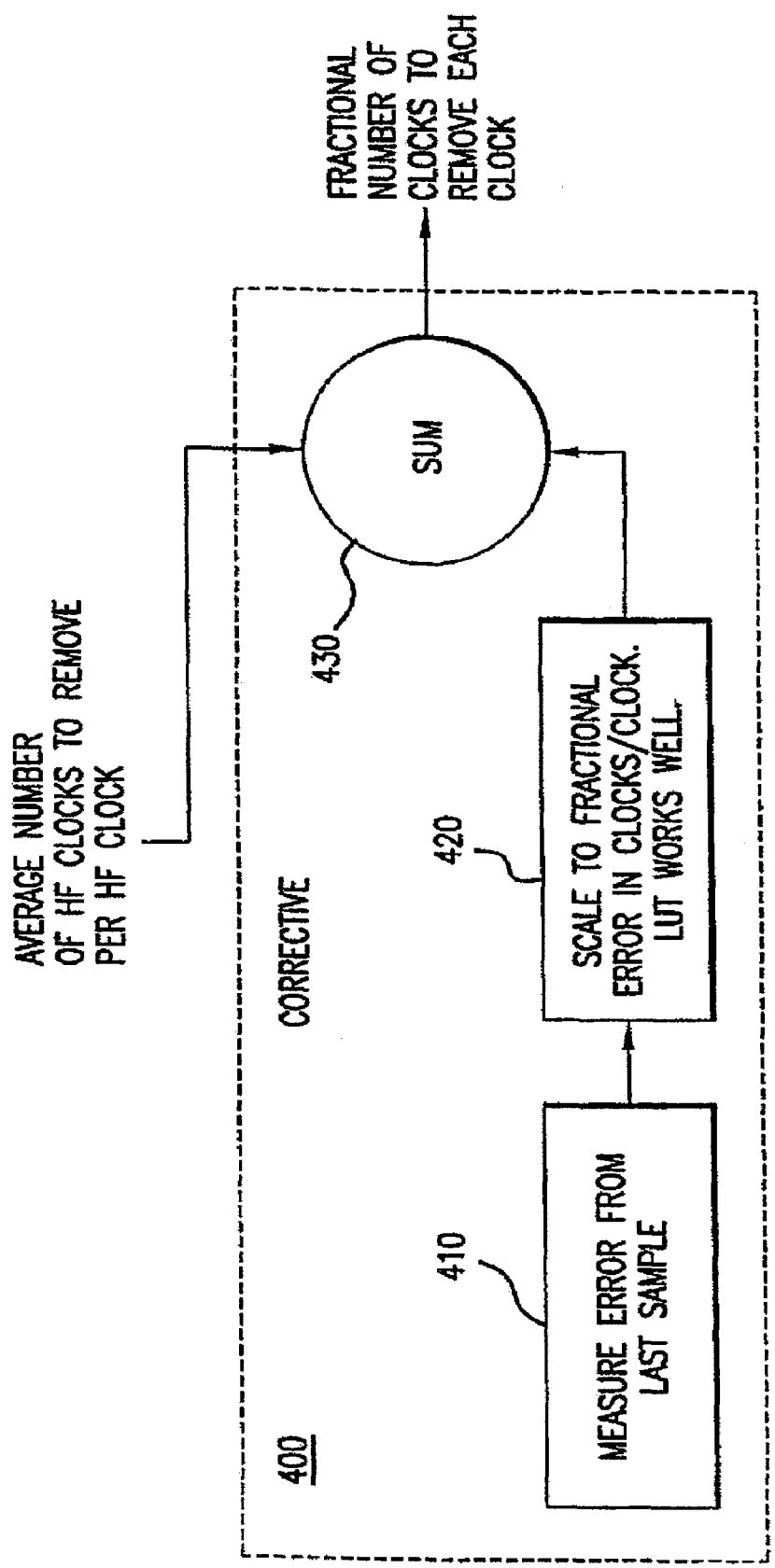
FIG. 8 is a flow process diagram 400 corresponding to the corrector 44 shown in FIG. 6.

FIG. 8 is a flow process diagram 400 corresponding to the corrector 44 shown in FIG. 6. In step 410 the error is measured from the last sample. In step 420, the error is scaled to a fractional error in terms of clocks/clock. In step 430, the scaled error is added to the average fractional number of HF clocks to remove per HF clock. The output represents a fractional number of clocks to remove each clock cycle.

In operation, the accumulator receives the fractional number of clocks to remove each clock cycle from the corrector. The output generator will remove a clock each time the accumulator output has a value greater than 1, e.g. has overflowed.

This embodiment generates a slower predictive value that indicates how much of each clock should be removed (on average). This should get the frequency close, but there can still be errors, so the 'Corrector' makes up for each sample's error. Instead of saying how many pixels to remove in a sample period, the output of the corrector is how much of a clock (a fractional amount) should be removed each clock. This way a large number of pulses can be removed in a very uniform way by having a large percentage of the pixel removed each clock. The accumulator has a running total of the fractional part and any time the sum is 1 or greater (it overflows—no need for keeping the integer part of the addition), the next clock is removed.

Since the predictor can get close, but is not able to track faster changes and may not estimate exactly correctly. The corrector looks at each sample period and generates an error term. This error term is then normalized to the number of clocks per period (for example: remove 1 clock during the sample period, which usually has 8 clocks, so remove ⅛ of a clock each clock during the next sample period). This error term is added to the Predictor's so that the accumulator can generate the best position and number of clocks to remove as possible.

The embodiment disclosed in FIG. 6 can handle removing many pulses during each sample period in a very nice way. This implementation provides more flexibility to chose frequencies since it is able to remove more than one pulse per sample period.

The invention claimed is:

1. A circuit comprising:
a frequency synthesizer configured to receive a dithered signal and a reference signal, and to generate a constant frequency output, the frequency synthesizer comprising:
a predictor and corrector configured to receive the dithered signal and the reference signal, and to generate a "remove pulse" signal; and
an output generator configured to output the dithered signal, reference signal, and "remove pulse" signal, and to generate a "clear pulse" signal and the constant frequency output.

2. A circuit, as defined in claim 1, further comprising a modulated analog phase lock loop configured to receive the reference signal, and generate the dithered signal.

3. A circuit, as defined in claim 1, further comprising one or more configuration registers configured to transceiver data and control signals with the frequency synthesizer.

4. A circuit comprising a frequency synthesizer configured to receive a dithered signal and a reference signal, and to generate a constant frequency output, the frequency synthesizer comprising:
a predictor configured to generate a first output signal indicative of the average number of dithered periods to remove per dithered period;
a corrector configured to receive the first output signal, and to generate a second output signal indicative of the fractional number of dithered periods to remove each dithered period; and
an accumulator configured to receive the second output signal, to count the fractional number of dithered periods, and to remove a dithered period when an integer has been reached.

5. A circuit, as defined in claim 4, the predictor comprising:
means for measuring the average number of dithered periods for the sample of the reference signal;
a comparator configured to receive the first output signal and a desired number of dithered periods per sample of the reference signal, and to generate a difference indicative of the average number of dithered periods to remove per sample of the reference signal; and
a multiplier configured to receive the difference, and to scale the difference according to a scale factor register value.

6. A circuit, as defined in claim 4, the corrector comprising:
means for measuring error from the last sample;
means for determining a scale to fractional error; and
an adder configured to receive the scale to fractional error and the average number of dithered periods to remove per dithered period, and to generate the difference.

7. A circuit comprising a frequency synthesizer configured to receive a dithered signal and a reference signal, and to generate a constant frequency output, the frequency synthesizer including:
a first synchronizer configured to receive the reference signal and the dithered signal, and to generate a first output;
an edge detector configured to receive the first output and the dithered signal, and to generate an edge signal;
a second synchronizer configured to receive an enable signal and the dithered signal, and to generate a second output;
an adder configured to receive reference count signals, and to generate adder output signals;
an Expected Count Latch configured to receive the second output as a clear input, the dithered signal as a clock input, the adder output signals as data, and the edge signal as a load signal, and to generate a latch output;
wherein the adder is further configured to receive the latch output;
an Edge Counter, configured to receive the dithered signal as a clock input and the second output as a clear signal, and to generate a counter output;
a comparator configured to receive the counter output and the latch output, and to generate a rollover output, an A>B+1 signal, and an A>B signal; and
a D type flip flop configured to be coupled to the comparator through a delay component and one or more logic gates, and further configured to generate the constant frequency output.

8. A method for frequency synthesis comprising:
receiving a dithered signal and a reference signal;
selecting a desired number of periods in the dithered signal to receive during a sample period of the reference signal;
counting the actual number of periods in the dithered signal during the sample period;
comparing the desired number to the actual number;
generating a constant frequency signal based on the comparison.

9. A method for frequency synthesis comprising:
receiving a dithered signal and a reference signal;
determining an average fractional number of dithered periods of the dithered signal to remove each dithered period;
determining a fractional error of dithered periods for each dithered period based on a period of the reference signal; and combining the average fractional number and the fractional error generating a fractional number of dithered periods to remove each dithered period; and generating a constant frequency signal based on the combination.

10. A method for frequency synthesis, as claimed in 9, determining an average fractional number of dithered periods comprising:

measuring an average number of dithered periods for a sample of the reference signal;

generating a difference from the average number of dithered periods and a desired number of dithered periods per sample of the reference signal, the difference indicative of the average number of dithered periods to remove per sample of the reference signal; and scaling the difference according to a scale factor register value.

11. A method for frequency synthesis, as defined in claim 9, further comprising determining a fractional error of dithered periods for each dithered period the determining comprising:

measuring error in a number of dithered periods corresponding to a given sample of the reference signal;

determining a scale to fractional error; and scaling the scale to fractional error to generate the fractional error.

12. A method for frequency synthesis, as defined in claim 11, wherein determining a scale to fractional error comprises referring to a look-up table.

13. An apparatus for frequency synthesis comprising:

a predictor configured to estimate an average amount of correction per sample;

a corrector configured to measure actual error in a previous sample;

an accumulator, connected to the predictor and corrector, and configured to generate an accumulator output signal indicative of the sum of the average amount of correction and the actual error;

an output generator, configured to receive the accumulator output signal, and to generate an output signal having constant frequency.

* * * * *